(12) United States Patent
Nagata

(10) Patent No.: US 7,521,937 B2
(45) Date of Patent: Apr. 21, 2009

(54) MEASUREMENT CIRCUIT AND TEST APPARATUS

(75) Inventor: Masahiro Nagata, Tokyo (JP)

(73) Assignee: Advantest Corporation, Tokyo (JP)

( * ) Notice: Subject to any disclaimer, the term of this patent is extended or adjusted under 35 U.S.C. 154(b) by 143 days.

(21) Appl. No.: 11/748,496

(22) Filed: May 15, 2007

(65) Prior Publication Data
US 2007/0268022 A1 Nov. 22, 2007

(30) Foreign Application Priority Data
May 19, 2006 (JP) ............................. 2006-140911

(51) Int. Cl.
*G01R 31/08* (2006.01)
*G01R 31/26* (2006.01)
(52) U.S. Cl. .................. 324/523; 324/527; 324/765
(58) Field of Classification Search ............... 324/523, 324/527, 765
See application file for complete search history.

(56) References Cited
U.S. PATENT DOCUMENTS
6,255,839 B1 * 7/2001 Hashimoto ............... 324/765
7,138,819 B2 * 11/2006 Hashimoto ............... 324/765
* cited by examiner

*Primary Examiner*—Vincent Q Nguyen
*Assistant Examiner*—Amy He
(74) *Attorney, Agent, or Firm*—Jianq Chyun IP Office

(57) ABSTRACT

There is provided a measurement circuit including a main amplifier that generates a direct voltage in accordance with an input voltage and applies the generated voltage to a device under test, a feedback element that feeds back the direct voltage to the main amplifier and controls the direct voltage generated from the main amplifier to a voltage according to the input voltage, a current detecting circuit that outputs a detecting voltage according to a current value of the direct current, and a clamping circuit that restricts the current value of the direct current output from the main amplifier, in which the clamping circuit includes a first limiting-voltage output section that outputs a limiting voltage according to a limiting value of the direct current, a first bias generating section that generates a bias voltage making use of the input voltage as a reference voltage based on a magnitude relation between the limiting voltage and the detecting voltage, and a limiting-current supplying element that is provided between a connecting point between the main amplifier and the feedback element and the first bias generating section and supplies a limiting current restricting the direct current to the device under test via the feedback element in accordance with a voltage difference between a voltage in the connecting point and the bias voltage.

17 Claims, 5 Drawing Sheets

MEASUREMENT CIRCUIT AND TEST APPARATUS

CROSS REFERENCE TO RELATED APPLICATION

The present application claims priority from a Japanese Patent Application No. 2006-140911 filed on May 19, 2006, the contents of which are incorporated herein by reference.

BACKGROUND

1. Field of the Invention

The present invention relates to a measurement circuit for measuring a device under test and a test apparatus including the measurement circuit. More particularly, the present invention relates to a measurement circuit for performing voltage-application current-measurement or current-application voltage-measurement.

2. Related Art

A direct-current test for a device under test has been known as a test item for the device under test such as a semiconductor circuit. Moreover, as a direct-current test, there is known a test for deciding the quality of a device under test based on a measurement result of voltage-application current-measurement for measuring a direct current supplied to the device under test when applying a predetermined direct voltage to the device under test and a test for deciding the quality of a device under test based on a measurement result of current-application voltage-measurement for measuring a direct voltage supplied to the device under test when supplying a predetermined direct current to the device under test.

Moreover, when performing this direct-current test, a measurement circuit including a circuit that restricts a direct current supplied to a device under test is known in order to prevent excess currents from being supplied to the device under test. FIG. 5 is a view exemplary showing a configuration of a conventional measurement circuit 400.

When applying a predetermined direct voltage to a device under test 300, the measurement circuit 400 is a circuit for measuring a direct current supplied to the device under test 300. A DA converter 402 generates a direct voltage to be applied to the device under test 300, and inputs it into a main amplifier 406. The main amplifier 406 generates an applied voltage according to this direct voltage, and applies it to the device under test 300. Moreover, this applied voltage is fed back to an input port of the main amplifier 406 in order to control the applied voltage output from the main amplifier 406 to a predetermined voltage.

A voltage detecting amplifier 412 detects a voltage of both ends of a current detecting resistor 408, and outputs a detecting voltage Vim obtained by amplifying this voltage. A DA converter 428 and a DA converter 416 output voltages according to a lower limit and an upper limit of a direct current supplied to the device under test 300.

For example, the DA converter 416 outputs an upper limit voltage according to the upper limit of the direct current. The upper limit voltage and the detecting voltage Vim are voltages having different polarity. Moreover, a voltage difference between the upper limit voltage and the detecting voltage Vim is divided by a resistor 418 and a resistor 420, and is input into an amplifier 414. For example, if an absolute value of the detecting voltage Vim becomes larger than an absolute value of the upper limit voltage, a positive voltage is input into a negative input terminal of the amplifier 414. As a result, the amplifier 414 outputs a negative voltage, and thus the state of a diode 424 becomes ON.

In this case, electric currents flow from the DA converter 402 to the diode 424. Since a voltage on the resistor 404 descends, an applied voltage applied to the device under test 300 descends, and a direct current flowing into the device under test 300 is restricted.

Now, since a related patent document is not recognized, the description is omitted.

However, in the conventional measurement circuit 400, a voltage output from the amplifier 414 is changed from the neighborhood of a power supply voltage of the amplifier 414 to the neighborhood of 0V. Since the fluctuation of voltage in a power point of the amplifier 414 is large, it was difficult that the conventional measurement circuit 400 performs current limiting at high speed.

SUMMARY

Therefore, it is an object of some aspects of the present invention to provide a measurement circuit and a test apparatus that can solve the foregoing problems. The above and other objects can be achieved by combinations described in the independent claims. The dependent claims define further advantageous and exemplary combinations of the present invention.

To solve the problem, according to the first aspect of the present invention, there is provided a measurement circuit that applies a predetermined direct voltage to a device under test and measures a direct current flowing into the device under test. The measurement circuit includes: a main amplifier that generates the direct voltage in accordance with an input voltage and applies the generated voltage to the device under test; a feedback element that feeds back the direct voltage to the main amplifier and controls the direct voltage generated from the main amplifier to a voltage according to the input voltage; a current detecting circuit that outputs a detecting voltage according to a current value of the direct current; and a clamping circuit that restricts the current value of the direct current output from the main amplifier, and the clamping circuit includes: a first limiting-voltage output section that outputs a limiting voltage according to a limiting value of the direct current; a first bias generating section that generates a bias voltage making use of the input voltage as a reference voltage based on a magnitude relation between the limiting voltage and the detecting voltage; and a limiting-current supplying element that is provided between a connecting point between the main amplifier and the feedback element and the first bias generating section and supplies a limiting current restricting the direct current to the device under test via the feedback element in accordance with a voltage difference between a voltage in the connecting point and the bias voltage.

The feedback element may be a feedback resistor and the limiting-current supplying element may be a first diode.

The first limiting-voltage output section may output an upper limit voltage according to an upper limit of the direct current, and the first bias generating section: may apply the bias voltage, forming a reverse bias to the first diode using the input voltage as a standard, to the first diode when a current value corresponding to the upper limit voltage is larger than a current value corresponding to the detecting voltage; and apply the bias voltage, forming a forward bias for the first diode using the input voltage as a standard, to the first diode when the current value corresponding to the upper limit voltage is not more than the current value corresponding to the detecting voltage, and make the device under test supply the limiting current via the feedback resistor.

The current detecting circuit may output the detecting voltage using the input voltage as a reference voltage, the first limiting-voltage output section may output the upper limit voltage having polarity reverse to that of the detecting voltage using the input voltage as a reference voltage, and the first bias generating section may include: a voltage dividing circuit that generates a divided voltage obtained by dividing the detecting voltage and the upper limit voltage by a predetermined division ratio; a differential amplifier of which a negative input terminal receives the divided voltage, a positive input terminal receives the input voltage, an output terminal is connected to an anode terminal of the first diode; and a second diode of which an anode terminal is connected to the negative input terminal of the differential amplifier and a cathode terminal is connected to the output terminal of the differential amplifier.

The clamping circuit may further include: a voltage follower circuit that receives a voltage on a cathode terminal of the first diode and outputs this voltage; and a first resistor that is provided between an output terminal of the voltage follower circuit and the negative input terminal of the differential amplifier.

The voltage dividing circuit may include: a second resistor of which one end receives the detecting voltage and the other end is connected to the negative input terminal of the differential amplifier; and a third resistor of which one end receives the upper limit voltage and the other end is connected to the negative input terminal of the differential amplifier.

The clamping circuit may further include: a second limiting-voltage output section that outputs a lower limit voltage according to a lower limit of the direct current; a second bias generating section that generates a bias voltage making use of the input voltage as a reference voltage based on a magnitude relation between the lower limit voltage and the detecting voltage; and a third diode that is provided between the connecting point between the main amplifier and the feedback resistor and the second bias generating section and draws a limiting current according to a voltage difference between a voltage on the connecting point and the bias voltage output from the second bias generating section from the direct current supplied to the device under test.

The second bias generating section: may apply the bias voltage, forming a forward bias for the third diode using the input voltage as a standard, to the third diode when a current value corresponding to the lower limit voltage is larger than a current value corresponding to the detecting voltage; and apply the bias voltage, forming a reverse bias to the third diode using the input voltage as a standard, to the third diode when the current value corresponding to the lower limit voltage is not more than the current value corresponding to the detecting voltage, and draw the limiting current via the feedback resistor.

The current detecting circuit may output the detecting voltage using the input voltage as a reference voltage, the second limiting-voltage output section may output the lower limit voltage having polarity reverse to that of the detecting voltage using the input voltage as a reference voltage, and the second bias generating section may include: a voltage dividing circuit that generates a divided voltage obtained by dividing the detecting voltage and the lower limit voltage by a predetermined division ratio; a differential amplifier of which a negative input terminal receives the divided voltage, a positive input terminal receives the input voltage, and an output terminal is connected to a cathode terminal of the third diode; and a fourth diode of which a cathode terminal is connected to the negative input terminal of the differential amplifier and an anode terminal is connected to the output terminal of the differential amplifier.

The current detecting circuit may include: a current detecting resistor that is provided between the output terminal of the main amplifier and the device under test; a current detecting amplifier that amplifies a voltage difference between both ends of the current detecting resistor; and a reference amplifier that converts the voltage output from the current detecting amplifier into the detecting voltage making use of the input voltage as a standard.

According to the second aspect of the present invention, there is provided a measurement circuit that supplies a predetermined direct current to a device under test and measures a direct voltage applied to the device under test. The measurement circuit includes: a main amplifier that generates the direct voltage in accordance with an input voltage and applies the generated voltage to the device under test; a current detecting circuit that outputs a detecting voltage according to the direct current supplied to the device under test; a feedback element that feeds back the detecting voltage output from the current detecting circuit to the main amplifier and controls the direct current supplied to the device under test to a predetermined current; a voltage detecting circuit that outputs a detecting voltage according to the direct voltage applied to the device under test; and a clamping circuit that restricts a voltage value of the direct voltage output from the main amplifier, and the clamping circuit includes: a first limiting-voltage output section that outputs a limiting voltage according to a limiting value of the direct voltage; a first bias generating section that generates a bias voltage making use of the input voltage as a reference voltage based on a magnitude relation between the limiting voltage and the detecting voltage; and a limiting-current supplying element that is provided between a connecting point between the main amplifier and the feedback element and the first bias generating section and supplies a limiting current according to a voltage difference between a voltage on the connecting point and the bias voltage to the current detecting circuit via the feedback element.

The feedback element may be a feedback resistor and the limiting-current supplying element may be a first diode.

According to the third aspect of the present invention, there is provided a test apparatus that tests a device under test. The test apparatus includes: a measurement circuit that applies a predetermined direct voltage to the device under test and measures a direct current to be supplied to the device under test; and a deciding section that decides a quality of the device under test based on a current value of the direct current measured by the measurement circuit, the measurement circuit includes: a main amplifier that generates the direct voltage in accordance with an input voltage and applies the generated voltage to the device under test; a feedback element that feeds back the direct voltage to the main amplifier and controls the direct voltage generated from the main amplifier to a voltage according to the input voltage; a current detecting circuit that outputs a detecting voltage according to a current value of the direct current; and a clamping circuit that restricts the current value of the direct current output from the main amplifier, and the clamping circuit includes: a first limiting-voltage output section that outputs a limiting voltage according to a limiting value of the direct current; a first bias generating section that generates a bias voltage making use of the input voltage as a reference voltage based on a magnitude relation between the limiting voltage and the detecting voltage; and a limiting-current supplying element that is provided between a connecting point between the main amplifier and the feedback element and the first bias generating section and supplies a limiting current restricting the direct current to the device under test via the feedback element in accordance with a voltage difference between a voltage in the connecting point and the bias voltage.

The feedback element may be a feedback resistor and the limiting-current supplying element may be a first diode.

According to the fourth aspect of the present invention, there is provided a test apparatus that tests a device under test. The test apparatus includes: a measurement circuit that supplies a predetermined direct current to the device under test and measures a direct voltage to be applied to the device under test; and a deciding section that decides a quality of the device under test based on a voltage value of the direct voltage measured by the measurement circuit, the measurement circuit includes: a main amplifier that generates the direct voltage in accordance with an input voltage and applies the generated voltage to the device under test; a current detecting circuit that outputs a detecting voltage according to the direct current supplied to the device under test; a feedback element that feeds back the detecting voltage output from the current detecting circuit to the main amplifier and controls the direct current supplied to the device under test to a predetermined current; a voltage detecting circuit that outputs a detecting voltage according to the direct voltage applied to the device under test; and a clamping circuit that restricts a voltage value of the direct voltage output from the main amplifier, and the clamping circuit includes: a first limiting-voltage output section that outputs a limiting voltage according to a limiting value of the direct voltage; a first bias generating section that generates a bias voltage making use of the input voltage as a reference voltage based on a magnitude relation between the limiting voltage and the detecting voltage; and a limiting-current supplying element that is provided between a connecting point between the main amplifier and the feedback element and the first bias generating section and supplies a limiting current according to a voltage difference between a voltage on the connecting point and the bias voltage to the current detecting circuit via the feedback element.

The feedback element may be a feedback resistor and the limiting-current supplying element may be a first diode.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
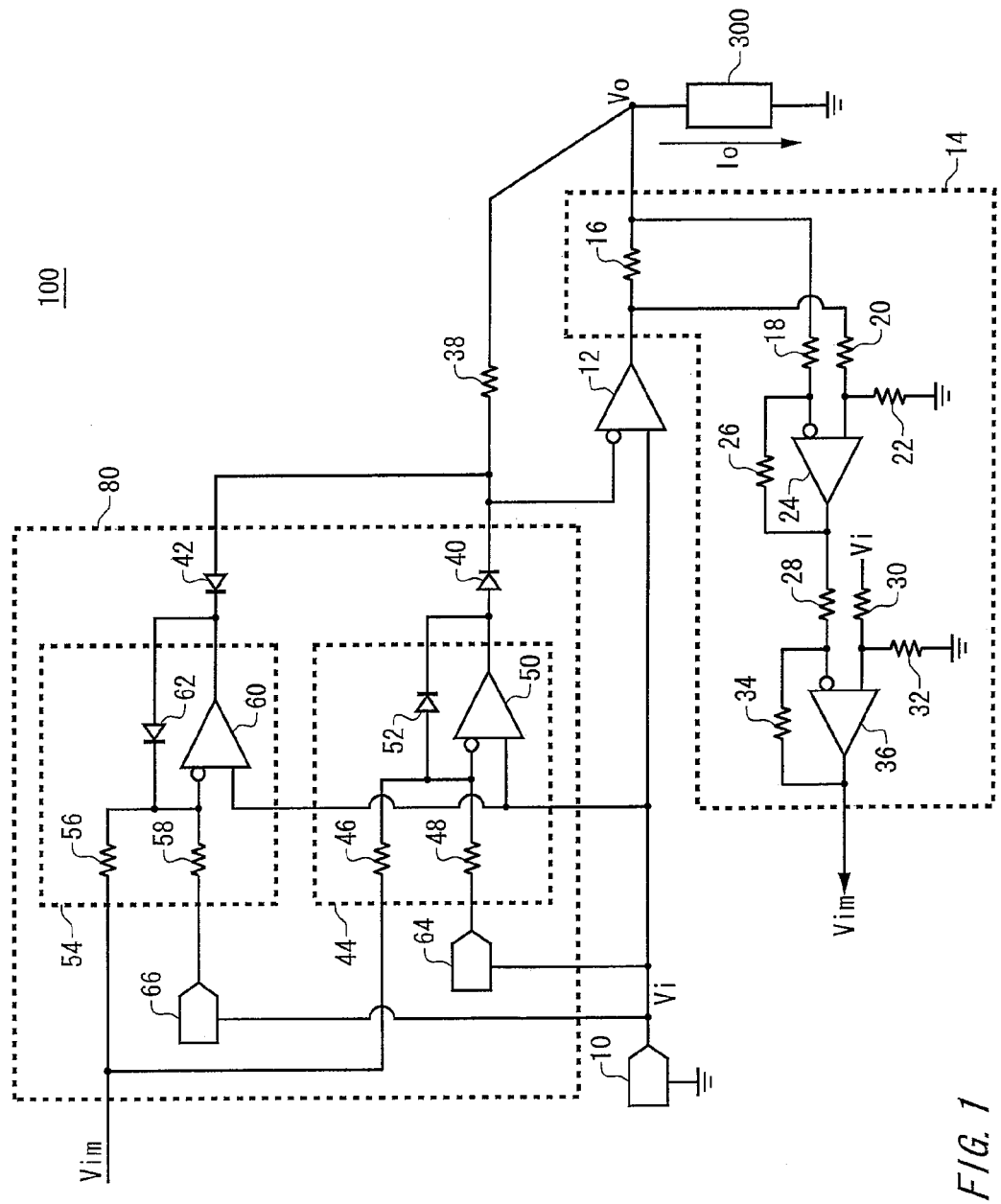
FIG. 1 is a view exemplary showing a configuration of a measurement circuit 100 according to an embodiment of the present invention.

FIG. 1 is a view exemplary showing a configuration of a measurement circuit 100 according to an embodiment of the present invention. The measurement circuit 100 is a circuit that performs voltage-application current-measurement on a device under test 300. In other words, the measurement circuit 100 applies a predetermined direct voltage to the device under test 300, and measures a direct current flowing into the device under test 300. The measurement circuit 100 in the present example includes a DA converter 10, a main amplifier 12, a feedback resistor 38, a current detecting circuit 14, and a clamping circuit 80.

The DA converter 10 outputs a voltage Vi to be applied to the device under test 300. For example, the DA converter 10 may output a voltage according to a preset digital value. The main amplifier 12 receives the voltage Vi output from the DA converter 10, and generates a direct voltage in accordance with this input voltage to apply the direct voltage to the device under test 300.

Moreover, the feedback resistor 38 feeds back a direct voltage Vo to be applied to the device under test 300 to the main amplifier 12, and controls the direct voltage generated from the main amplifier 12 to a voltage according to the input voltage Vi. For example, the main amplifier 12 is a differential amplifier, of which a positive input terminal may receive the input voltage Vi, a negative input terminal may receive the direct voltage Vo, and an output terminal may be connected to the device under test 300. Moreover, the main amplifier 12 may output the direct voltage Vo substantially equal to the input voltage Vi.

The current detecting circuit 14 detects a current value of a direct current to be supplied from the main amplifier 12 to the device under test 300, and outputs a detecting voltage according to this current value. The current detecting circuit 14 in the present example has a current detecting resistor 16, a current detecting amplifier 24, a reference amplifier 36, and a plurality of resistors (18, 20, 22, 26, 28, 30, 32, and 34).

The current detecting resistor 16 is provided between an output port of the main amplifier 12 and an input port of the device under test 300. The current detecting amplifier 24 is, e.g., a differential amplifier, and amplifies and outputs a voltage difference between both ends of the current detecting resistor 16.

In the present example, a positive input terminal of the current detecting amplifier 24 is connected to the output port of the main amplifier 12 via the resistor 20 and is also connected to ground potential via the resistor 22. Moreover, a negative input terminal of the current detecting amplifier 24 is connected to the input port of the device under test 300 via the resistor 18 and is also connected to an output port of the current detecting amplifier 24 via the resistor 26. In other words, the current detecting amplifier 24 outputs a voltage according to a voltage difference between both ends of the current detecting resistor 16 using ground potential as a standard.

The reference amplifier 36 is, e.g., a differential amplifier, and outputs a voltage output from the current detecting amplifier 24 as a detecting voltage Vim using the input voltage Vi as a reference voltage. In the present example, a positive input terminal of the reference amplifier 36 is supplied with the input voltage Vi via the resistor 30. Moreover, the positive input terminal of the reference amplifier 36 is connected to ground potential via the resistor 32. Moreover, a negative input terminal of the reference amplifier 36 is connected to an output terminal of the current detecting amplifier 24 via the resistor 28 and is connected to an output terminal of the reference amplifier 36 via the resistor 34.

The clamping circuit 80 restricts the current value of the direct current output from the main amplifier 12. When the current value of the direct current detected from the current detecting circuit 14 is larger than a predetermined upper limit, the clamping circuit 80 supplies electric currents to the device under test 300 via the feedback resistor 38 in order to descend an applied voltage to be applied to the device under test 300 and reduce a direct current to be supplied to the device under test 300. Moreover, when the current value of the direct current detected from the current detecting circuit 14 is smaller than a predetermined lower limit, the clamping circuit 80 draws electric currents via the feedback resistor 38 in order to raise an applied voltage to be applied to the device under test 300 and increase a direct current to be supplied to the device under test 300.

The clamping circuit 80 has a first limiting-voltage output section 64, a second limiting-voltage output section 66, a first bias generating section 44, a second bias generating section 54, a first diode 40, and a third diode 42. The first limiting-voltage output section 64 and the second limiting-voltage output section 66 output a limiting voltage according to a limiting value of a direct current. In the present example, the first limiting-voltage output section 64 outputs an upper limit voltage according to an upper limit of a direct current and the second limiting-voltage output section 66 outputs a lower limit voltage according to a lower limit of the direct current. The first limiting-voltage output section 64 and the second limiting-voltage output section 66 are, e.g., a DA converter, and output an upper limit voltage and a lower limit voltage using the input voltage Vi as a reference voltage in accordance with a set digital value.

The first bias generating section 44 and the second bias generating section 54 generate a bias voltage making use of the input voltage as a reference voltage based on a magnitude relation between the limiting voltage and the detecting voltage Vim. In the present example, the first bias generating section 44 generates a first bias voltage using the input voltage Vi as a reference voltage based on a magnitude relation between the upper limit voltage and the detecting voltage Vim, and the second bias generating section 54 generates a second bias voltage using the input voltage Vi as a reference voltage based on a magnitude relation between the lower limit voltage and the detecting voltage Vim.

The first diode 40 is provided between a connecting point between the main amplifier 12 and the feedback resistor 38 and the first bias generating section 44. The first diode 40 supplies a limiting current restricting a direct current to the device under test 300 via the feedback resistor 38 in accordance with a voltage difference between a voltage on this connecting point and the first bias voltage provided from the first bias generating section 44.

For example, when a current value corresponding to the upper limit voltage is larger than a current value corresponding to the detecting voltage Vim, the first bias generating section 44 applies a bias voltage, forming a reverse bias to the first diode 40 using the input voltage Vi as a reference voltage, to the first diode 40. In this case, electric currents do not flow between the first diode 40 and the feedback resistor 38.

Moreover, when the current value corresponding to the upper limit voltage is not more than the current value corresponding to the detecting voltage Vim, the first bias generating section 44 applies a bias voltage, forming a forward bias for the first diode 40 using the input voltage Vi as a reference voltage, to the first diode 40. In this case, electric currents according to the bias voltage are supplied from the first diode 40 to the feedback resistor 38. The direct current to be supplied to the device under test 300 is restricted due to a voltage drop in the feedback resistor 38.

The first bias generating section 44 in the present example has a voltage dividing circuit having a resistor 46 and a resistor 48, a differential amplifier 50, and a second diode 52. Moreover, the first limiting-voltage output section 64 outputs an upper limit voltage having polarity reverse to that of the detecting voltage Vim using an input voltage as a reference voltage. For example, the first limiting-voltage output section 64 may output a negative voltage for the reference voltage (the input voltage Vi) when the detecting voltage Vim is a positive voltage for a reference voltage (the input voltage Vi).

The resistor 46 and the resistor 48 generate a divided voltage obtained by dividing the detecting voltage Vim and the upper limit voltage by a predetermined division ratio. This division ratio may be one to one. In other words, resistance values of the resistor 46 and the resistor 48 may be substantially equal to each other. In this case, a sign of this divided voltage changes according to a magnitude relation between a voltage value of the detecting voltage Vim for a reference voltage and a voltage value of the upper limit voltage for the reference voltage. In other words, a magnitude relation between the detecting voltage and the upper limit voltage can be distinguished by the sign of this divided voltage.

The differential amplifier 50 receives the divided voltage output from the voltage dividing circuit through its negative input terminal and receives the input voltage Vi through its positive input terminal. Moreover, an output terminal of the differential amplifier 50 is connected to an anode terminal of the first diode 40. Moreover, an anode terminal of the second diode 52 is connected to the negative input terminal of the differential amplifier 50 and a cathode terminal thereof is connected to the output terminal of the differential amplifier 50.

When the detecting voltage Vim is not more than the upper limit voltage, the differential amplifier 50 outputs a voltage less than or equal to the reference voltage (the input voltage Vi). In this case, the second diode 52 becomes an ON state, and a voltage on the output terminal of the differential amplifier 50 becomes substantially equal to a voltage obtained by subtracting a forward voltage of the second diode 52 from the reference voltage (the input voltage Vi). Since a voltage on a cathode terminal of the first diode 40 is substantially equal to the input voltage Vi, the first diode 40 becomes an OFF state, and electric currents do not flow from the first diode 40 to the feedback resistor 38.

Moreover, the differential amplifier 50 outputs a voltage higher than the reference voltage (the input voltage Vi) when the detecting voltage Vim is larger than the upper limit voltage. In this case, the first diode 40 becomes an ON state, and electric currents flow from the first diode 40 to the feedback resistor 38 and thus the direct current to be supplied to the device under test 300 is restricted. At this time, a voltage on the output terminal of the differential amplifier 50 becomes substantially equal to a voltage obtained by adding the forward voltage of the first diode 40 to the voltage (the applied voltage Vo☐Vin) on the cathode terminal of the first diode 40.

In this manner, according to the clamping circuit 80 in the present example, a voltage on the output terminal of the differential amplifier 50 is fluctuated in a ±Vf range using the input voltage Vi as a standard (however, Vf shows a forward voltage of a diode). For this reason, voltage fluctuation on the output terminal of the differential amplifier 50 becomes small and thus current limiting can be performed at high speed.

As above, it has been explained about a configuration and an operation of the first bias generating section 44 and the first diode 40. A configuration and an operation of the second bias generating section 54 and the third diode 42 are also similar to them.

As described above, the second bias generating section 54 generates the second bias voltage using the input voltage Vi as a reference voltage based on a magnitude relation between the lower limit voltage and the detecting voltage Vim. The third diode 42 is provided between a connecting point between the main amplifier 12 and the feedback resistor 38 and the second bias generating section 54. The third diode 42 draws a limiting current restricting a direct current from the direct current to be supplied to the device under test 300 via the feedback resistor 38 in accordance with a voltage difference between a voltage on this connecting point and the second bias voltage provided from the second bias generating section 54.

For example, when a current value corresponding to the lower limit voltage is not more than a current value corresponding to the detecting voltage Vim, the second bias generating section 54 applies a bias voltage, forming a reverse bias to the third diode 42 using the input voltage Vi as a reference voltage, to the third diode 42. In this case, electric currents do not flow between the third diode 42 and the feedback resistor 38.

Moreover, when the current value corresponding to the lower limit voltage is larger than the current value corresponding to the detecting voltage Vim, the second bias generating section 54 applies a bias voltage, forming a forward bias for the third diode 42 using the input voltage Vi as a reference voltage, to the third diode 42. In this case, the third diode 42 draws electric currents according to the bias voltage via the feedback resistor 38. Due to a voltage rise in the feedback resistor 38, the direct current to be supplied to the device under test 300 is restricted so as to be larger than an electric current corresponding to the lower limit voltage.

The second bias generating section 54 in the present example has a voltage dividing circuit having a resistor 56 and a resistor 58, a differential amplifier 60, and a fourth diode 62. Moreover, the second limiting-voltage output section 66 outputs a lower limit voltage having polarity reverse to that of the detecting voltage Vim using an input voltage as a reference voltage. For example, the second limiting-voltage output section 66 may output a negative voltage for the reference voltage (the input voltage Vi) when the detecting voltage Vim is a positive voltage for a reference voltage (the input voltage Vi).

The resistor 56 and the resistor 58 generate a divided voltage obtained by dividing the detecting voltage Vim and the lower limit voltage by a predetermined division ratio. This division ratio may be one to one. In other words, resistance values of the resistor 56 and the resistor 58 may be substantially equal to each other. In this case, a sign of this divided voltage changes according to a magnitude relation between a voltage value of the detecting voltage Vim for the reference voltage and a voltage value of the lower limit voltage for the reference voltage. In other words, a magnitude relation between the detecting voltage and the lower limit voltage can be distinguished by the sign of this divided voltage.

The differential amplifier 60 receives a divided voltage output from the voltage dividing circuit through its negative input terminal and receives the input voltage Vi through its positive input terminal. Moreover, an output terminal of the differential amplifier 60 is connected to a cathode terminal of the third diode 42. Moreover, a cathode terminal of the fourth diode 62 is connected to the negative input terminal of the differential amplifier 60 and an anode terminal thereof is connected to the output terminal of the differential amplifier 60.

When the detecting voltage Vim is not more than the lower limit voltage, the differential amplifier 60 outputs a voltage less than or equal to the reference voltage (the input voltage Vi). In this case, the third diode 42 becomes an ON state, and a voltage on the output terminal of the differential amplifier 50 becomes substantially equal to a voltage obtained by subtracting a forward voltage of the third diode 42 from a voltage (an applied voltage Vo□Vin on an anode terminal of the third diode 42.

Moreover, the differential amplifier 60 outputs a voltage higher than the reference voltage (the input voltage Vi) when the detecting voltage Vim is larger than the lower limit voltage. In this case, the fourth diode 62 becomes an ON state, and a voltage on the output terminal of the differential amplifier 60 becomes substantially equal to a voltage obtained by adding a forward voltage of the fourth diode 62 to the reference voltage (the input voltage Vin).

In this manner, according to the clamping circuit 80 in the present example, a voltage on the output terminal of the differential amplifier 60 is fluctuated in a ±Vf range using the input voltage Vi as a standard (however, Vf shows a forward voltage of a diode). For this reason, voltage fluctuation on the output terminal of the differential amplifier 60 becomes small and thus current limiting can be performed at high speed.

Figure 2:
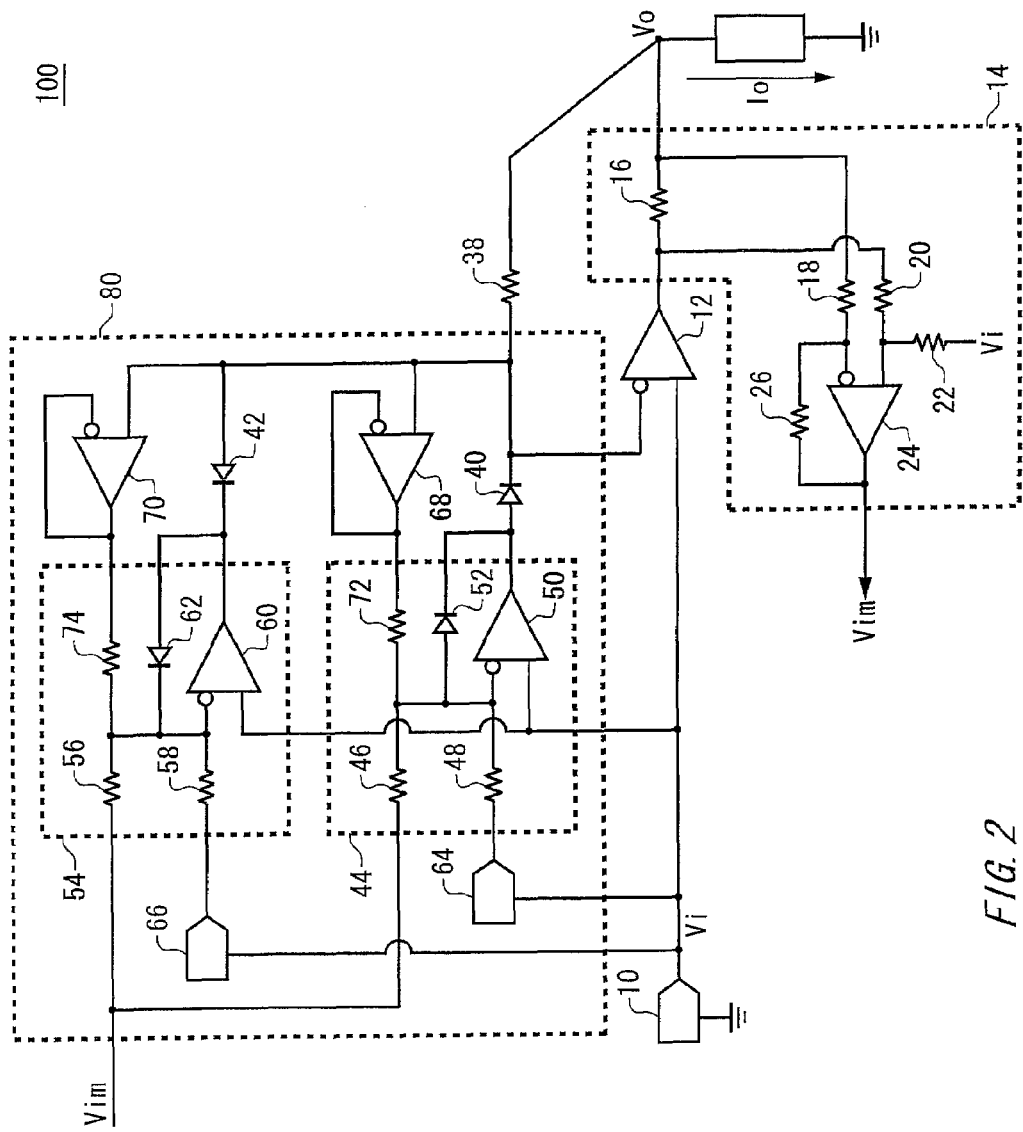
FIG. 2 is a view showing another example of a configuration of the measurement circuit 100.

FIG. 2 is a view showing another example of a configuration of the measurement circuit 100. The measurement circuit 100 in the present example further includes a voltage follower circuit 68, a voltage follower circuit 70, a resistor 72, and a resistor 74, in addition to a configuration of the measurement circuit 100 described in FIG. 1. The other components may have the same function and configuration as those of the components in FIG. 1 of which reference numerals are the same as those of the other components.

The voltage follower circuit 68 receives a voltage on the cathode terminal of the first diode 40, and outputs this voltage. The resistor 72 is provided between an output terminal of the voltage follower circuit 68 and the negative input terminal of the differential amplifier 50.

Moreover, the voltage follower circuit 70 receives a voltage on the anode terminal of the third diode 42, and outputs this voltage. The resistor 74 is provided between an output terminal of the voltage follower circuit 70 and the negative input terminal of the differential amplifier 60. Moreover, it is preferable that resistance values of the resistor 72 and the resistor 74 are smaller than resistance values of the resistor 48 and the resistor 58.

Since the differential amplifier 50 or the differential amplifier 60 is serially connected to the main amplifier 12, it is also conceivable that the outputs of these amplifiers oscillate. For this reason, it is preferable that an amplification factor in the differential amplifier 50 and the differential amplifier 60 is restricted to an amplification factor that does not produce oscillation.

However, when restricting the amplification factor in the differential amplifier 50 and the differential amplifier 60, DC precision for current limiting deteriorates. On the contrary, according to the measurement circuit 100 in the present example, since the voltage on the cathode terminal of the first diode 40 and the voltage on the anode terminal of the third diode 42 are fed back to the negative input terminals of the differential amplifier 50 and the differential amplifier 60 by means of the voltage follower circuit 68 and the voltage follower circuit 70, the aggravation of DC precision for current limiting can be reduced even if the amplification factor of the differential amplifier 50 and the differential amplifier 60 is restricted.

Figure 3:
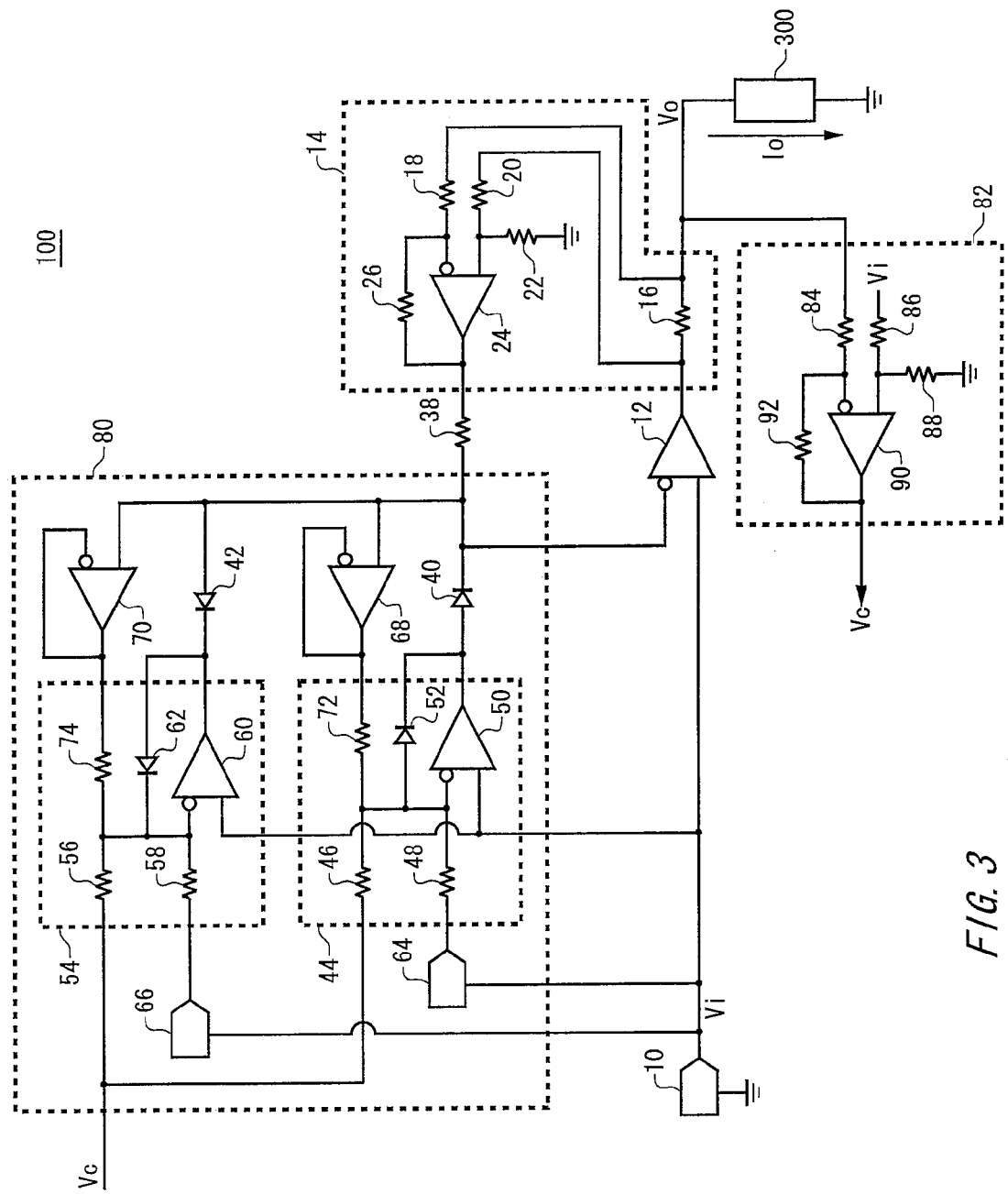
FIG. 3 is a view showing another example of a configuration of the measurement circuit 100.

FIG. 3 is a view showing another example of a configuration of the measurement circuit 100. The measurement circuit 100 in the present example is a circuit that performs current-application voltage-measurement for a device under test 300. In other words, the measurement circuit 100 supplies a predetermined direct current to the device under test 300, and measures a direct voltage to be applied to the device under test 300. The measurement circuit 100 in the present example includes a DA converter 10, a main amplifier 12, a feedback resistor 38, a current detecting circuit 14, a voltage detecting circuit 82, and a clamping circuit 80.

The DA converter 10 outputs a voltage Vi according to the direct current to be supplied to the device under test 300. For example, the DA converter 10 may output a voltage according to a preset digital value. The main amplifier 12 receives the voltage Vi output from the DA converter 10, generates a direct voltage in accordance with this input voltage, and applies it to the device under test 300.

The current detecting circuit 14 detects a current value of the direct current to be supplied from the main amplifier 12 to the device under test 300, and outputs a detecting voltage according to this current value. The current detecting circuit 14 may have a configuration substantially equal to that of the current detecting circuit 14 described in FIG. 1. The current detecting circuit 14 in the present example has a configuration except for the reference amplifier 36 and the plurality of resistors (28, 30, 32, and 34) from a configuration of the current detecting circuit 14 described in FIG. 1.

An output terminal of the current detecting amplifier 24 is connected to a negative input terminal of the main amplifier 12 via the feedback resistor 38. By such a configuration, the direct current to be supplied from the main amplifier 12 to the device under test 300 can be preserved to a predetermined current value.

The voltage detecting circuit 82 outputs a detecting voltage according to an applied voltage Vo to be applied to the device under test 300. The voltage detecting circuit 82 in the present example has a voltage detecting amplifier 90 and a plurality of resistors (84, 86, 88, and 92).

The voltage detecting amplifier 90 is, e.g., a differential amplifier, and its negative input terminal receives the applied voltage Vo via the resistor 84. Moreover, a positive input terminal of the voltage detecting amplifier 90 is supplied with the input voltage Vi via the resistor 86, and is connected to ground potential via the resistor 88.

Moreover, the resistor 92 connects an output terminal of the voltage detecting amplifier 90 and the negative input terminal. By such a configuration, the voltage detecting amplifier 90 outputs a detecting voltage Vc according to the applied voltage Vo using the input voltage Vi as a standard.

The clamping circuit 80 restricts a voltage value of the applied voltage Vo output from the main amplifier 12. When a voltage value of the applied voltage Vo detected by the voltage detecting circuit 82 is larger than a predetermined upper limit, the clamping circuit 80 supplies electric currents to the feedback resistor 38 in order to descend an applied voltage to be applied to the device under test 300. Moreover, when the voltage value of the applied voltage Vo detected by the voltage detecting circuit 82 is smaller than a predetermined lower limit, the clamping circuit 80 draws electric currents from the feedback resistor 38 in order to raise an applied voltage to be applied to the device under test 300.

The clamping circuit 80 may have a configuration similar to that of the clamping circuit 80 described in FIG. 1 or 2. The clamping circuit 80 in the present example has the same configuration as that of the clamping circuit 80 described in FIG. 2. However, the first limiting-voltage output section 64 outputs an upper limit voltage according to an upper limit of an applied voltage, and the second limiting-voltage output section 66 outputs a lower limit voltage according to a lower limit of the applied voltage. An operation of the clamping circuit 80 is similar to that of the clamping circuit 80 described in FIG. 1 or 2.

By such a configuration, a voltage value of an applied voltage to be applied to the device under test 300 can be restricted. Moreover, as described in FIG. 1, voltages on the output terminals of the differential amplifier 50 and the differential amplifier 60 are fluctuated in a ±Vf range using the input voltage Vi as a standard (however, Vf shows a forward voltage of a diode). For this reason, voltage fluctuation on the output terminals of the differential amplifier 50 and the differential amplifier 60 are reduced and thus voltage limiting can be performed at high speed.

Figure 4:
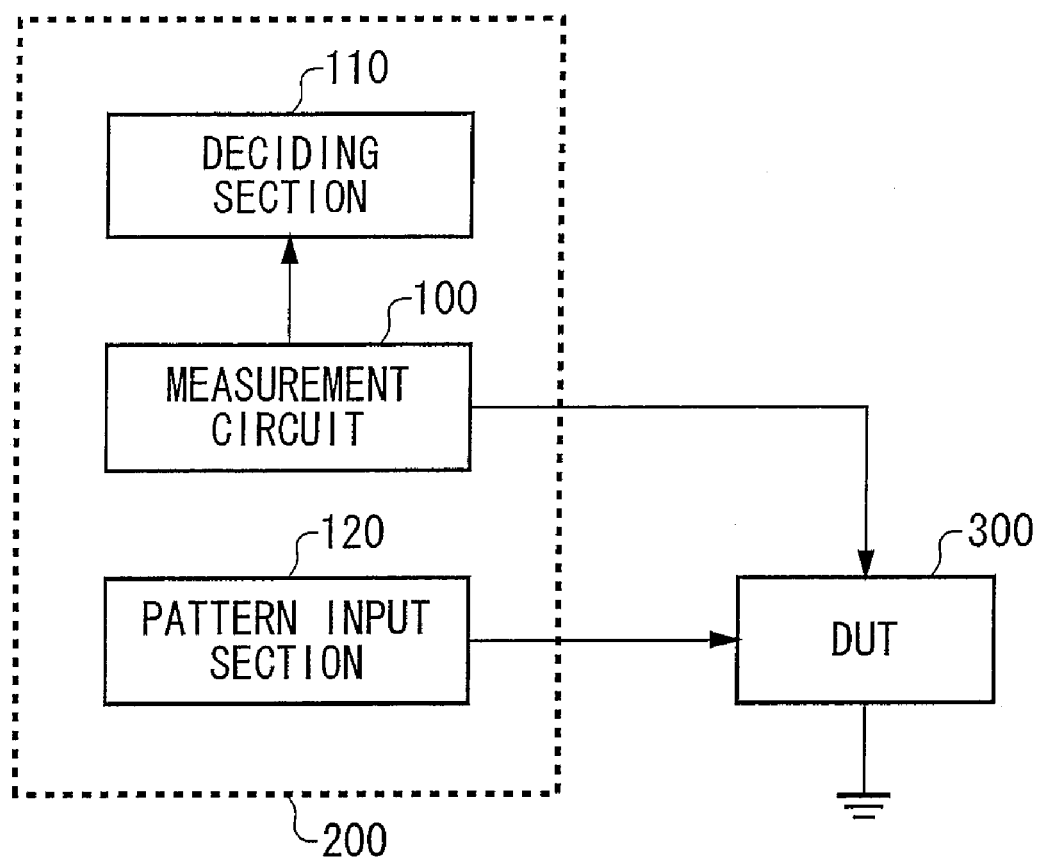
FIG. 4 is a view exemplary showing a configuration of a test apparatus 200 according to an embodiment of the present invention.
Figure 5:
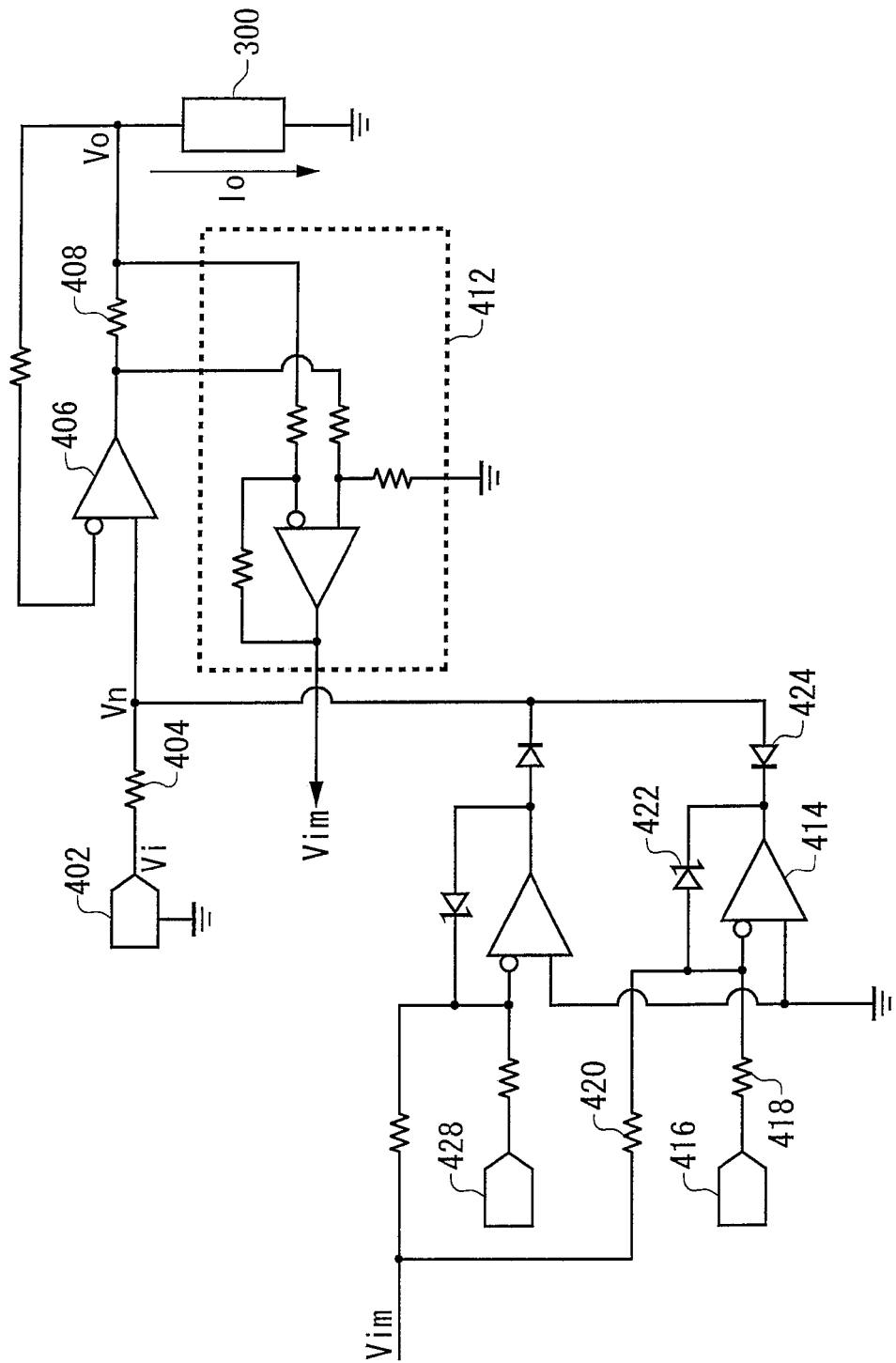
FIG. 5 is a view showing a conventional measurement circuit 400.

FIG. 4 is a view exemplary showing a configuration of a test apparatus 200 according to an embodiment of the present invention. The test apparatus 200 is an apparatus that tests the device under test 300 such as a semiconductor circuit, and includes a measurement circuit 100, a pattern input section 120, and a deciding section 110.

The measurement circuit 100 is the same circuit as the measurement circuit 100 described in FIGS. 1 to 3. In other words, the measurement circuit 100 performs voltage-application current-measurement or current-application voltage-measurement for the device under test 300.

The deciding section 110 decides a quality of the device under test 300 on the basis of a measurement result in the measurement circuit 100. For example, the deciding section 110 may compute a current value of a direct current to be supplied to the device under test 300 and decide a quality of the device under test 300 based on whether this current value is within a predetermined range, on the basis of an output from the current detecting amplifier 24 described in FIG. 1. Moreover, the deciding section 110 may compute a voltage value of a direct voltage to be applied to the device under test 300 and decide a quality of the device under test 300 based on whether this voltage value is within a predetermined range, on the basis of an output from the voltage detecting amplifier 90 described in FIG. 3.

Moreover, when performing a direct-current test for the device under test 300 during rest, the measurement circuit 100 may perform measurement in a state where the pattern input section 120 does not input test patterns. Moreover, when performing a direct-current test for the device under test 300 during an operation, the measurement circuit 100 may perform measurement in a state where the pattern input section 120 inputs test patterns. For example, the pattern input section 120 may input test patterns that sequentially change a state of a predetermined logic circuit of the device under test 300.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to an embodiment of the present invention, it is possible to realize a measurement circuit and a test apparatus that can restrict a direct voltage or a direct current to be supplied to a device under test at high speed.

What is claimed is:

1. A measurement circuit that applies a predetermined direct voltage to a device under test and measures a direct current flowing into the device under test, the measurement circuit comprising:
a main amplifier that generates the direct voltage in accordance with an input voltage and applies the generated voltage to the device under test;
a feedback element that feeds back the direct voltage to the main amplifier and controls the direct voltage generated from the main amplifier to a voltage according to the input voltage;
a current detecting circuit that outputs a detecting voltage according to a current value of the direct current; and
a clamping circuit that restricts the current value of the direct current output from the main amplifier, and
the clamping circuit comprising:
a first limiting-voltage output section that outputs a limiting voltage according to a limiting value of the direct current;
a first bias generating section that generates a bias voltage making use of the input voltage as a reference voltage based on a magnitude relation between the limiting voltage and the detecting voltage; and
a limiting-current supplying element that is provided between a connecting point between the main amplifier and the feedback element and the first bias generating section and supplies a limiting current restricting the direct current to the device under test via the feedback element in accordance with a voltage difference between a voltage in the connecting point and the bias voltage.

2. The measurement circuit as claimed in claim 1, wherein the feedback element is a feedback resistor and the limiting-current supplying element is a first diode.

3. The measurement circuit as claimed in claim 2, wherein the first limiting-voltage output section outputs an upper limit voltage according to an upper limit of the direct current, and
the first bias generating section:
applies the bias voltage, forming a reverse bias to the first diode using the input voltage as a standard, to the first diode when a current value corresponding to the upper limit voltage is larger than a current value corresponding to the detecting voltage; and
applies the bias voltage, forming a forward bias for the first diode using the input voltage as a standard, to the first diode when the current value corresponding to the upper limit voltage is not more than the current value corresponding to the detecting voltage, and makes the device under test supply the limiting current via the feedback resistor.

4. The measurement circuit as claimed in claim 3, wherein the current detecting circuit outputs the detecting voltage using the input voltage as a reference voltage,
the first limiting-voltage output section outputs the upper limit voltage having polarity reverse to that of the detecting voltage using the input voltage as a reference voltage, and
the first bias generating section comprises:
a voltage dividing circuit that generates a divided voltage obtained by dividing the detecting voltage and the upper limit voltage by a predetermined division ratio;
a differential amplifier of which a negative input terminal receives the divided voltage, a positive input terminal receives the input voltage, an output terminal is connected to an anode terminal of the first diode; and
a second diode of which an anode terminal is connected to the negative input terminal of the differential amplifier and a cathode terminal is connected to the output terminal of the differential amplifier.

5. The measurement circuit as claimed in claim 4, wherein the clamping circuit further comprises:
a voltage follower circuit that receives a voltage on a cathode terminal of the first diode and outputs this voltage; and
a first resistor that is provided between an output terminal of the voltage follower circuit and the negative input terminal of the differential amplifier.

6. The measurement circuit as claimed in claim 5, wherein the voltage dividing circuit comprises:
a second resistor of which one end receives the detecting voltage and the other end is connected to the negative input terminal of the differential amplifier; and
a third resistor of which one end receives the upper limit voltage and the other end is connected to the negative input terminal of the differential amplifier.

7. The measurement circuit as claimed in claim 4, wherein the current detecting circuit comprises:
a current detecting resistor that is provided between the output terminal of the main amplifier and the device under test;
a current detecting amplifier that amplifies a voltage difference between both ends of the current detecting resistor; and
a reference amplifier that converts the voltage output from the current detecting amplifier into the detecting voltage making use of the input voltage as a standard.

8. The measurement circuit as claimed in claim 3, wherein the clamping circuit further comprises:
a second limiting-voltage output section that outputs a lower limit voltage according to a lower limit of the direct current;
a second bias generating section that generates a bias voltage making use of the input voltage as a reference voltage based on a magnitude relation between the lower limit voltage and the detecting voltage; and
a third diode that is provided between the connecting point between the main amplifier and the feedback resistor and the second bias generating section and draws a limiting current according to a voltage difference between a voltage on the connecting point and the bias voltage output from the second bias generating section from the direct current supplied to the device under test.

9. The measurement circuit as claimed in claim 8, wherein the second bias generating section:
applies the bias voltage, forming a forward bias for the third diode using the input voltage as a standard, to the third diode when a current value corresponding to the lower limit voltage is larger than a current value corresponding to the detecting voltage; and
applies the bias voltage, forming a reverse bias to the third diode using the input voltage as a standard, to the third diode when the current value corresponding to the lower limit voltage is not more than the current value corresponding to the detecting voltage, and draws the limiting current via the feedback resistor.

10. The measurement circuit as claimed in claim 9, wherein the current detecting circuit outputs the detecting voltage using the input voltage as a reference voltage, the second limiting-voltage output section outputs the lower limit voltage having polarity reverse to that of the detecting voltage using the input voltage as a reference voltage, and the second bias generating section comprises:

a voltage dividing circuit that generates a divided voltage obtained by dividing the detecting voltage and the lower limit voltage by a predetermined division ratio;

a differential amplifier of which a negative input terminal receives the divided voltage, a positive input terminal receives the input voltage, and an output terminal is connected to a cathode terminal of the third diode; and a fourth diode of which a cathode terminal is connected to the negative input terminal of the differential amplifier and an anode terminal is connected to the output terminal of the differential amplifier.

11. The measurement circuit as claimed in claim 10, wherein the current detecting circuit comprises:

a current detecting resistor that is provided between the output terminal of the main amplifier and the device under test;

a current detecting amplifier that amplifies a voltage difference between both ends of the current detecting resistor; and a reference amplifier that converts the voltage output from the current detecting amplifier into the detecting voltage making use of the input voltage as a standard.

12. A measurement circuit that supplies a predetermined direct current to a device under test and measures a direct voltage applied to the device under test, the measurement circuit comprising:

a main amplifier that generates the direct voltage in accordance with an input voltage and applies the generated voltage to the device under test;

a current detecting circuit that outputs a detecting voltage according to the direct current supplied to the device under test;

a feedback element that feeds back the detecting voltage output from the current detecting circuit to the main amplifier and controls the direct current supplied to the device under test to a predetermined current;

a voltage detecting circuit that outputs a detecting voltage according to the direct voltage applied to the device under test; and a clamping circuit that restricts a voltage value of the direct voltage output from the main amplifier, and the clamping circuit comprising:

a first limiting-voltage output section that outputs a limiting voltage according to a limiting value of the direct voltage;

a first bias generating section that generates a bias voltage making use of the input voltage as a reference voltage based on a magnitude relation between the limiting voltage and the detecting voltage; and a limiting-current supplying element that is provided between a connecting point between the main amplifier and the feedback element and the first bias generating section and supplies a limiting current according to a voltage difference between a voltage on the connecting point and the bias voltage to the current detecting circuit via the feedback element.

13. The measurement circuit as claimed in claim 12, wherein the feedback element is a feedback resistor and the limiting-current supplying element is a first diode.

14. A test apparatus that tests a device under test, comprising:

a measurement circuit that applies a predetermined direct voltage to the device under test and measures a direct current to be supplied to the device under test; and a deciding section that decides a quality of the device under test based on a current value of the direct current measured by the measurement circuit, the measurement circuit comprising:

a main amplifier that generates the direct voltage in accordance with an input voltage and applies the generated voltage to the device under test;

a feedback element that feeds back the direct voltage to the main amplifier and controls the direct voltage generated from the main amplifier to a voltage according to the input voltage;

a current detecting circuit that outputs a detecting voltage according to a current value of the direct current; and a clamping circuit that restricts the current value of the direct current output from the main amplifier, and the clamping circuit comprising:

a first limiting-voltage output section that outputs a limiting voltage according to a limiting value of the direct current;

a first bias generating section that generates a bias voltage making use of the input voltage as a reference voltage based on a magnitude relation between the limiting voltage and the detecting voltage; and a limiting-current supplying element that is provided between a connecting point between the main amplifier and the feedback element and the first bias generating section and supplies a limiting current restricting the direct current to the device under test via the feedback element in accordance with a voltage difference between a voltage in the connecting point and the bias voltage.

15. The test apparatus as claimed in claim 14, wherein the feedback element is a feedback resistor and the limiting-current supplying element is a first diode.

16. A test apparatus that tests a device under test, comprising:

a measurement circuit that supplies a predetermined direct current to the device under test and measures a direct voltage to be applied to the device under test; and a deciding section that decides a quality of the device under test based on a voltage value of the direct voltage measured by the measurement circuit, the measurement circuit comprising:

a main amplifier that generates the direct voltage in accordance with an input voltage and applies the generated voltage to the device under test;

a current detecting circuit that outputs a detecting voltage according to the direct current supplied to the device under test;

a feedback element that feeds back the detecting voltage output from the current detecting circuit to the main amplifier and controls the direct current supplied to the device under test to a predetermined current;

a voltage detecting circuit that outputs a detecting voltage according to the direct voltage applied to the device under test; and a clamping circuit that restricts a voltage value of the direct voltage output from the main amplifier, and the clamping circuit comprising:

a first limiting-voltage output section that outputs a limiting voltage according to a limiting value of the direct voltage;

a first bias generating section that generates a bias voltage making use of the input voltage as a reference voltage based on a magnitude relation between the limiting voltage and the detecting voltage; and a limiting-current supplying element that is provided between a connecting point between the main amplifier and the feedback element and the first bias generating section and supplies a limiting current according to a voltage difference between a voltage on the connecting point and the bias voltage to the current detecting circuit via the feedback element.

17. The test apparatus as claimed in claim 16, wherein the feedback element is a feedback resistor and the limiting-current supplying element is a first diode.

* * * * *